United States Patent
Fu et al.

(10) Patent No.: US 10,705,362 B2
(45) Date of Patent: Jul. 7, 2020

(54) CURVED DISPLAY DEVICE AND FABRICATION METHOD

(71) Applicant: Shanghai Tianma Micro-electronics Co., Ltd., Shanghai (CN)

(72) Inventors: Cheng Fu, Shanghai (CN); Yincheng Ding, Shanghai (CN); Xiaosong Song, Shanghai (CN); Chuanzhi Xu, Shanghai (CN); Mengning Hu, Shanghai (CN); Xiaoye Li, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/023,577

(22) Filed: Jun. 29, 2018

(65) Prior Publication Data
US 2019/0271874 A1 Sep. 5, 2019

(30) Foreign Application Priority Data
Mar. 2, 2018 (CN) .......................... 2018 1 0173798

(51) Int. Cl.
| | | |
|---|---|---|
| G02F 1/1333 | (2006.01) | |
| F21V 8/00 | (2006.01) | |
| G06F 3/041 | (2006.01) | |
| H01L 27/32 | (2006.01) | |

(Continued)

(52) U.S. Cl.
CPC ..... *G02F 1/133308* (2013.01); *G02B 6/0053* (2013.01); *G02F 1/13338* (2013.01); *G06F 3/041* (2013.01); *H01L 27/323* (2013.01); *H01L 51/0097* (2013.01); *H01L 51/5237* (2013.01); *H01L 51/5275* (2013.01); *G02F 2001/133331* (2013.01); *G06F 2203/04102* (2013.01);

(Continued)

(58) Field of Classification Search
CPC ......... G02F 1/133308; G02F 1/133305; G02F 2001/133325; G02F 1/1336; G02F 1/1339; G02F 2001/133314; G02F 2001/133317; G02F 2001/133331; G02F 2201/46; G02F 2202/28; G09F 9/301; G09G 3/36
See application file for complete search history.

(56) References Cited

U.S. PATENT DOCUMENTS

| | | | |
|---|---|---|---|
| 2008/0007668 A1* | 1/2008 | Mishima | G02B 6/0011 349/58 |
| 2009/0201137 A1* | 8/2009 | Weller | B60R 1/12 340/425.5 |
| 2009/0316062 A1 | 12/2009 | Nishizawa | |

(Continued)

FOREIGN PATENT DOCUMENTS

| | | |
|---|---|---|
| CN | 102033664 A | 4/2011 |
| CN | 103941455 A | 7/2014 |

(Continued)

*Primary Examiner* — Michael J Eurice
(74) *Attorney, Agent, or Firm* — Anova Law Group PLLC

(57) ABSTRACT

A curved display device and a fabrication method are provided. The curved display device comprises: a cover lens; a display panel, wherein the display panel and the cover lens are bonded together as an integral having a curved surface; and a module, wherein a supporter is provided at each of at least two ends of the module. The supporter provided at the each of at least two ends of the module is directly bonded to the cover lens.

19 Claims, 10 Drawing Sheets

(51) Int. Cl.
*H01L 51/00* (2006.01)
*H01L 51/52* (2006.01)

(52) U.S. Cl.
CPC .............. *G06F 2203/04103* (2013.01); *H01L 2251/5338* (2013.01)

(56) References Cited

U.S. PATENT DOCUMENTS

| | | | | |
|---|---|---|---|---|
| 2012/0087122 | A1* | 4/2012 | Takeuchi | G02F 1/133603 362/235 |
| 2013/0249848 | A1* | 9/2013 | Borrelli | C03C 15/00 345/173 |
| 2013/0277186 | A1* | 10/2013 | Sekizawa | H03K 17/9618 200/181 |
| 2014/0125900 | A1* | 5/2014 | Li | G02F 1/133308 349/42 |
| 2015/0163939 | A1* | 6/2015 | Park | G02F 1/13452 361/749 |
| 2015/0253615 | A1* | 9/2015 | Ryu | G02F 1/133512 349/58 |
| 2015/0256658 | A1* | 9/2015 | Shin | G06F 1/1637 455/566 |
| 2015/0261033 | A1* | 9/2015 | Shin | H05K 5/0086 349/58 |
| 2016/0202726 | A1* | 7/2016 | Seen | H04M 1/0268 349/42 |
| 2016/0282669 | A1* | 9/2016 | Lee | G02F 1/133605 |
| 2017/0017107 | A1* | 1/2017 | Schwager | G02F 1/133308 |
| 2017/0123245 | A1* | 5/2017 | Iwai | G02F 1/133514 |
| 2018/0004028 | A1* | 1/2018 | Lu | G06F 3/041 |
| 2018/0004033 | A1 | 1/2018 | Yoo et al. | |
| 2018/0052274 | A1* | 2/2018 | Nichol | G02B 6/0018 |
| 2018/0292709 | A1* | 10/2018 | Takada | G02F 1/133528 |
| 2019/0152831 | A1* | 5/2019 | An | C03B 23/0307 |
| 2019/0155090 | A1* | 5/2019 | Arihara | G02F 1/133308 |
| 2019/0163003 | A1* | 5/2019 | Kim | G02F 1/1333 |
| 2019/0272058 | A1* | 9/2019 | Noma | G06F 3/044 |

FOREIGN PATENT DOCUMENTS

| | | |
|---|---|---|
| CN | 204009291 U | 12/2014 |
| CN | 104297999 A | 1/2015 |
| CN | 105158956 A | 12/2015 |
| CN | 105938265 A | 9/2016 |
| CN | 106023808 A | 10/2016 |
| CN | 206040129 U | 3/2017 |
| CN | 106773346 A | 5/2017 |
| CN | 107329301 A | 11/2017 |

* cited by examiner

CURVED DISPLAY DEVICE AND FABRICATION METHOD

CROSS-REFERENCES TO RELATED APPLICATIONS

This application claims the priority of Chinese Patent Application No. 201810173798.8, filed on Mar. 2, 2018, the entire contents of which are incorporated herein by reference.

FIELD OF THE DISCLOSURE

The present disclosure generally relates to the display technology and, more particularly, relates to a curved display device and a fabrication method thereof.

BACKGROUND

Curved display device or curved surface display device generally refers to a display device having a display panel with radians. The radians of the curved display panel ensure an equal distance between the eyes, and the excessive viewing distance at both ends of the display device may be avoided, such that curved display devices are able to provide better visual experience than flat display devices, thereby bringing better sensory experience. In addition to different visual experience, the curved display panel has a certain radius and, thus, the curved display panel occupies a smaller area than the flat display panel.

FIG. 1 illustrates a schematic diagram of an existing curved display device. As shown in FIG. 1, the curved display device includes a curved cover lens 14, a curved display panel 12, and a module 10. The module 10 also has a curved structure. The curved module 10 includes a frame 104 and an optical structure 102. The curved display panel 12 is disposed between the curved cover lens 14 and the curved module 10. Generally, the edge of the curved cover lens 14 exceeds the edge of the curved display panel 12 and, thus, in the assembly process, an accurate alignment between the curved display panel 12 and the module 10 may be difficult to be achieved. In particular, an accurate alignment between the display panel 12 and the optical structure 102 in the module 10 may be difficult to be achieved. Thus, the curved display panel 12 is likely to be misaligned during the assembly process, resulting assembly stress.

In addition, the existing molding process of the curved optical structure is not yet mature, which may result a mismatch between the actual curvature of the optical structure 102 and the curvature of the display panel 12. To solve this problem, in the assembly process the display panel 12 and the module 10 are bonded to each other by the double-side adhesive tape, such that the curvature of the optical structure 102 and the curvature of the display panel 12 tend to coincide with each other. However, the assembly process involving the double-side adhesive tape may cause the display panel 12 to be subjected to an additional load of the module 10, thereby degrading the overall optical performance of the module 10.

The disclosed curved display device and a fabrication method thereof are directed to solve one or more problems set forth above and other problems.

BRIEF SUMMARY OF THE DISCLOSURE

One aspect of the present disclosure provides a curved display device. The curved display device comprises: a cover lens; a display panel, wherein the display panel and the cover lens are bonded together as an integral having a curved surface; and a module, wherein a supporter is provided at each of at least two ends of the module. The supporter provided at the each of at least two ends of the module is directly bonded to the cover lens.

Another aspect of the present disclosure provides a fabrication method for a curved display device. The fabrication method comprises: providing a cover lens; providing a display panel and bonding the display panel and the cover together as an integral having a curved surface; providing a module, wherein each of at least two ends of the module is provided with a supporter; and bonding the supporter provided at the each of at least two ends of the module to the cover lens. The supporter provided at the each of at least two ends of the module is directly bonded to the cover lens.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
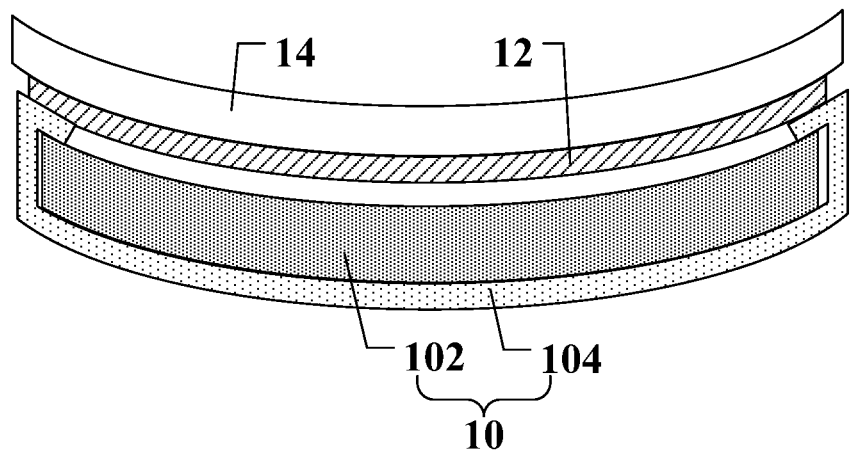
FIG. 1 illustrates a schematic diagram of an existing curved display device.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Each embodiment in the present disclosure is described in a progressive manner, and each embodiment focuses on the difference from other embodiments, and the same or similar parts among the respective embodiments may refer to each other. In the present disclosure, the disclosed device corresponds to the disclosed method and, thus, the description of the disclosed device is relatively simple, and the relevant part of the disclosed device can be referred to the description of the disclosed method.

The present disclosure provides an improved curved surface display device and a fabrication method thereof, which are capable of reducing assembly stress caused by misalignment, and preventing the backlight module from generating additional load on the display panel.

Figure 2:
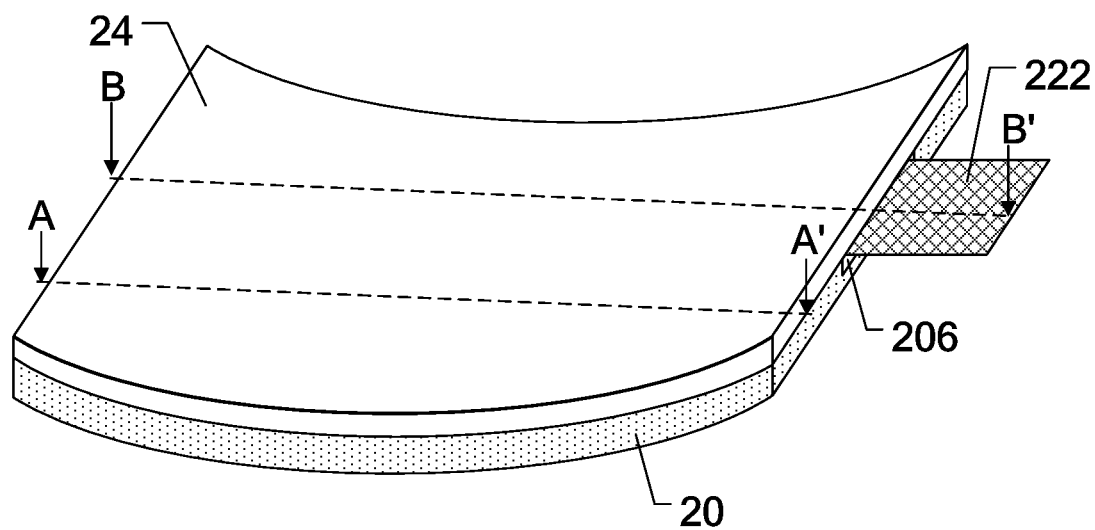
FIG. 2 illustrates a schematic diagram of an exemplary curved display device consistent with disclosed embodiments.
Figure 3:
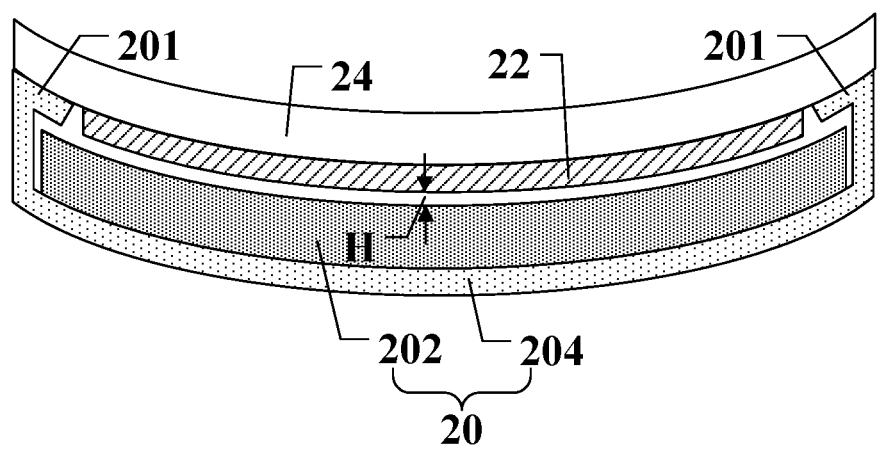
FIG. 3 illustrates an exemplary AA' sectional view of an exemplary curved display device in FIG. 2 consistent with disclosed embodiments.

FIG. 2 illustrates a schematic diagram of an exemplary curved display device consistent with disclosed embodiments, FIG. 3 illustrates an exemplary AA' sectional view of an exemplary curved display device in FIG. 2 consistent with disclosed embodiments.

As shown in FIG. 2 and FIG. 3, the curved display device may include a cover lens 24, a display panel 22, and a module structure/module 20. The display panel 22 and the cover lens 24 may be bonded together as an integral having a curved surface. A supporter 201 may be respectively provided on at least two ends of the module 20, and the supporter 201 and the cover lens 24 may be directly bonded/fixed. In one embodiment, a gap may be provided between the display panel 22 and the supporter 201, in another embodiment, any gaps may not be provided between the display panel 22 and the supporter 201, as long as the module 20 is prevented from generating an additional load on the display panel 22 during the assembly process.

In particular, the display panel 22 and the cover lens 24 may be bonded together to form an integral having a curved surface in various ways. In one embodiment, a flat display panel and a flat cover lens may be first fixed together, then stamped together to form the integral having the curved surface. In another embodiment, the flat display panel may be first stamped to have a curved surface, and the flat cover lens may be also first stamped to have a curved surface, in which the curvature of the curved surface of the stamped display panel matches the curvature of the curved surface of the stamped cover lens. Then the stamped display panel and the stamped cover lens may be fix together form an integral having a curved surface. The curved surface of the formed integral may have the same curvature as the stamped cover lens and the stamped display panel.

In general, in a curved liquid crystal display device, the module 20 may include a frame 204 and an optical structure 202. The frame 204 may be configured to fix the optical structure 202. The optical structure 202 may include a light source and a medium that transmits the light emitted by the light source. In one embodiment, the light source may be a light-emitting diode (LED), and the medium that transmits the light emitted by the light source may include a light guide plate, and a prism sheet, etc. In practical applications, the medium that transmits the light emitted by the light source may further include at least one of a diffusion sheet, a brightness enhancement film, and a reflection sheet according to various design requirements.

As shown in FIG. 2 and FIG. 3, the "the supporter 201 and the cover lens 24 may be directly bonded/fixed" means that all the base substrates for carrying the functional film layer in the display panel may not be directly seen from the appearance of the curved display device. That is, at every edge of the curved display device, the cover lens 24 may be in direct contact with the module 20, and the edge of any base substrate may not be directly observed from the appearance of the curved display device.

It should be noted that the display panel may include one base substrate, two base substrates, or more than two base substrates, which may be determined according to various application scenarios. In one embodiment, the display panel may be an organic light-emitting diode (OELD) display panel, whether the display panel includes one base substrate or two base substrates may be determined according to the encapsulation process of the OLED display panel. When the encapsulation process is a thin film encapsulation, only one base substrate may be used, and when the encapsulation process is a cover lens encapsulation, i.e., a frit encapsulation process, two base substrates may be used. In another embodiment, the display panel may be a liquid crystal display (LCD) panel, and two base substrates are desired. In another embodiment, the display panel may be any appropriate display panels and the desired number of the base substrates may be determined accordingly, which is not limited by the present disclosure.

In the disclosed curved display device, the cover lens 24 and the module 20 may be directly bonded/fixed, and a double-side adhesive tape may not be disposed between the display panel 22 and the module 20. That is, the display panel may be not in direct contact with the module, such that the module may be prevented from generating an additional load on the display panel during the assembly process, and the overall optical performance of the display panel may be enhanced.

In one embodiment, the display panel 22 may further include a flexible circuit board. The module 20 may have a first side close to the flexible circuit board and an opposing second side far away from the flexible circuit board. A first opening may be provided at the first side of the module 20. A corresponding structure is shown in FIG. 4.

Figure 4:
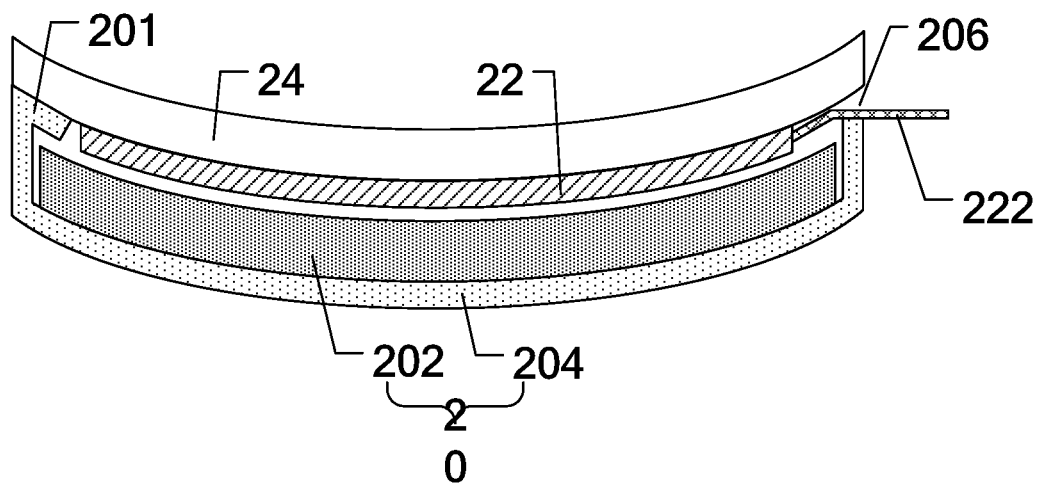
FIG. 4 illustrates an exemplary BB' sectional view of an exemplary curved display device in FIG. 2 consistent with disclosed embodiments.

FIG. 4 illustrates an exemplary BB' sectional view of an exemplary curved display device in FIG. 2 consistent with disclosed embodiments. As shown in FIG. 2 and FIG. 4, the display panel 22 may be provided with a flexible circuit board 222 at one side of the display panel 22. The module 20 may have a first side close to the flexible circuit board 222 and an opposing second side far away from the flexible circuit board 222. A first opening 206 may be configured at the first side of the module 20. In particular, the first opening 206 may be arranged at one side of the frame 204 of the module 20. The flexible circuit board 222 may electrically connect with at least one of an external power source and an external drive signal. Therefore, the flexible circuit board 222 may be electrically connected to the at least one of the external power source and the external driving signal after going through the first opening 206 and, meanwhile, the display panel 22 may be still prevented from being applied with an additional load generated by the module 20.

In one embodiment, the width of the first opening 206 may be larger than the width of the flexible circuit board 222. For example, the width of the first opening 206 may be 1.01-1.10 times the width of the flexible circuit board 222, such that provided that the flexible circuit board 222 is able to go through the first opening 206 of the module 20, external dust may be prevented from entering the interior of the curved display device. Accordingly, the display failure caused by the dust interference to the optical path inside the curved display device may be suppressed.

Figure 5:
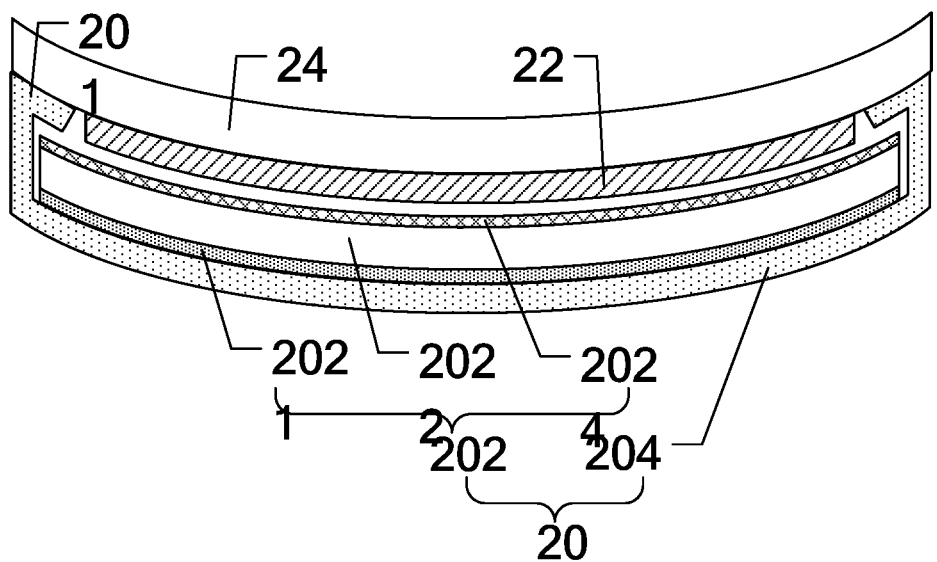
FIG. 5 illustrates another exemplary AA' sectional view of an exemplary curved display device in FIG. 2 consistent with disclosed embodiments.

In another embodiment, the curved display device may not be provided with a flexible circuit board. To achieve the normal operation of the display panel, a power generator may be disposed in the curved display device. The power generator may obtain power from an external power source through wireless charging, thereby driving the display panel. A corresponding structure is shown in FIG. 5. As shown in FIG. 2 and FIG. 5, an annular seal may be implemented between the cover lens 24 and the module 20, where the "annular seal" means that the cover lens 24 and the module 20 may not be provided with any openings. The module 20 may be provided with a ring-shaped supporter 201, and the cover lens 24 may be bonded/fixed to the ring-shaped supporter 201 at an entire ring shape (i.e., a full circle) of the supporter 201.

In one embodiment, a gap may be provided between the display panel and the optical structure. A corresponding structure is shown in FIG. 3. As shown in FIG. 3, a gap H may be provided between the display panel 22 and the optical structure 202. The gap H may ensure that no assembly stress is generated between the display panel 22 and the optical structure 202. That is, the display panel 22 may be not in direct contact with the optical structure 202. The size of the gap H may be determined according to various application scenarios. In one embodiment, the gap H may be configured approximately from 0.4 mm to 0.8 mm, which may ensure that the assembly stress is not generated between the display panel 22 and the optical structure 202. Meanwhile, the entire display device may not be substantially thick.

In one embodiment, the optical structure 202 of the module 20 may include a light guide plate and a prism sheet, and a corresponding structure is shown in FIG. 5.

FIG. 5 illustrates another exemplary AA' sectional view of an exemplary curved display device in FIG. 2 consistent with disclosed embodiments. The similarities between FIG. 5 and FIG. 2 are not repeated, while certain differences may be explained.

As shown in FIG. 5, in the direction from the frame 204 to the display panel 22, the optical structure 20 may be sequentially provided with a reflective sheet 2021, a light guide plate 2022, and a prism sheet 2024. The reflective sheet 2021 may reflect the light emitted towards the frame 204 when propagating in the light guide plate 2022, which may improve the utilization of the light source.

The curved display device may also include an LED lamp (not drawn in FIG. 5) on one side of the optical structure 204. In practical applications, the prism sheet 2024 may include multiple sheets. In addition, for quantum dot light-emitting display devices and organic light-emitting display devices, the above-mentioned optical structure in FIG. 5 may not be provided.

In certain embodiments, as shown in FIG. 3 to FIG. 5, the frame 204 is illustrated as an integrated one-piece structure, which is for illustrative purposes and is not intended to limit the scope of the present disclosure. In certain other embodiments, the frame 204 may also include an plastic frame which includes the supporter 201, and a corresponding structure is shown in FIG. 6.

Figure 6:
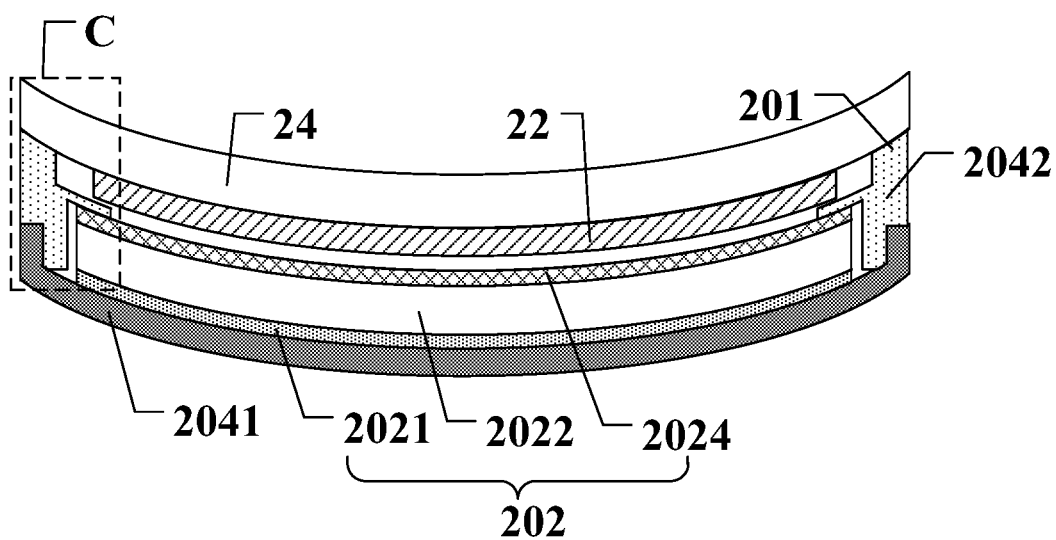
FIG. 6 illustrates another exemplary AA' sectional view of an exemplary curved display device in FIG. 2 consistent with disclosed embodiments.

FIG. 6 illustrates another exemplary AA' sectional view of an exemplary curved display device in FIG. 2 consistent with disclosed embodiments. The similarities between FIG. 6 and FIG. 2 are not repeated, while certain differences may be explained.

As shown in FIG. 6, the frame 204 may include a back plate 2041 and an plastic frame 2042. The plastic frame 2042 may be fitted/engaged into the back plate 2041. The supporter 201 may be a part of the plastic frame 2042 and, thus, the supporter 201 may be fitted/engaged into the back plate 2041. Referring to FIG. 2 and FIG. 6, the plastic frame 2042 may be disposed surrounding the display panel 22. When the display panel 22 is provided with a flexible circuit board, the plastic frame 2042 may be provided with an opening at a position corresponding to the flexible circuit board, such that the flexible circuit board may be connected to other structures through the opening.

Further, the plastic frame 2042 may include an extension component, and the extension component may be in direct contact with the optical structure 202. A corresponding structure is shown in FIG. 7.

Figure 7:
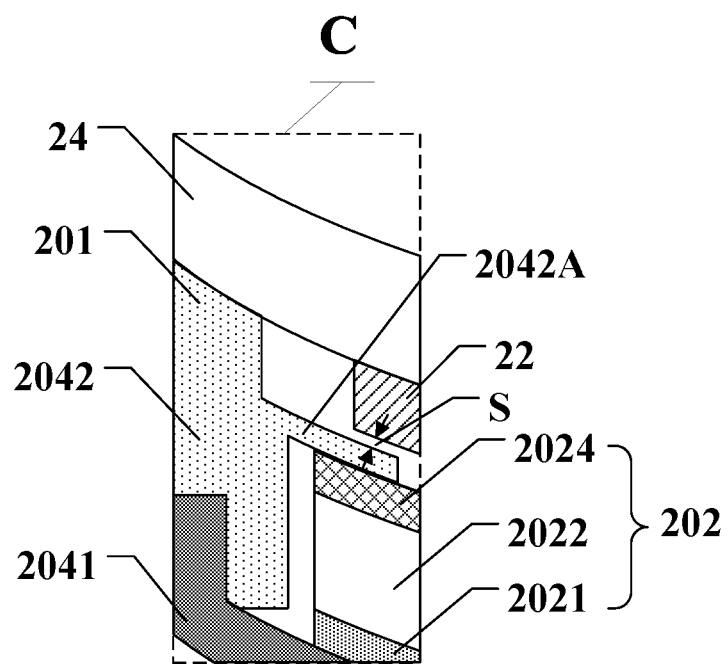
FIG. 7 illustrates an enlarged view of a region C in another exemplary AA' sectional view in FIG. 6 consistent with disclosed embodiments.

FIG. 7 illustrates an enlarged view of a region C in another exemplary AA' sectional view in FIG. 6 consistent with disclosed embodiments. As shown in FIG. 6 and FIG. 7, the plastic frame 2042 may include an extension component 2042A, which may further fix/bond the optical structure 202, such that during the operation of the display device, the movement of each optical film in the optical structure 202 may be suppressed, and a change of the light corresponding to the edges of the display panel 22 may be suppressed. Accordingly, display abnormality at the edges of the display panel 22 may be suppressed.

In the disclosed embodiments, the extension component 2042A may be in direct contact with the optical structure 202, such that the extension component 2042A may be able to further fix/bond the optical structure 202.

In one embodiment, as shown in FIG. 7, the extension component 2042A and the display panel 22 may have an overlapped region, and a first gap S may be provided between the display panel 22 and the extension component 2042A at the overlapped region. The first gap S may be approximately greater than or equal to 0.2 mm and less than or equal to 0.4 mm. Through configuring the first gap S between the display panel 22 and the extension component 2042A at the overlapped region, a direct contract between the display panel 22 and the extension component 2042A, which causes assembly stress to the display panel 22, may be prevented.

In the disclosed embodiments, although the cover lens 24 and the supporter 201 are directly fixed/bonded, i.e., all edges of the display panel 22 do not overlap with the supporter 201, in certain embodiments the display panel 22 may overlap with the plastic frame 2042. A corresponding structure is shown in FIG. 8.

Figure 8:
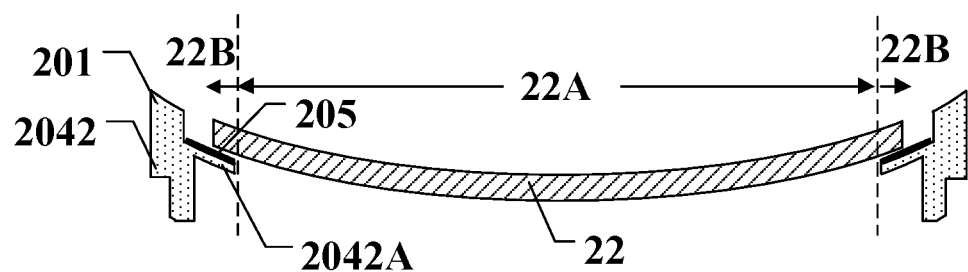
FIG. 8 illustrates a schematic diagram of an exemplary relative position of a cover lens and an plastic frame in another exemplary AA' sectional view in FIG. 6 consistent with disclosed embodiments.

FIG. 8 illustrates a schematic diagram of a relative position of a display panel and an plastic frame in another exemplary AA' sectional view in FIG. 6 consistent with disclosed embodiments. As shown in FIG. 8, the display panel 22 may include a display area 22A and a non-display area 22B. To reduce the border of the curved display device, the non-display area 22B may overlap with the extension component 2042A.

In one embodiment, as shown in FIG. 8, the extension component 2042A may have a first side facing the display panel 22 and an opposing second side, and a single-side foam adhesive tape 205 may be provided on the first side of the extension component 2042A, i.e., the side facing toward the display panel 22. The single-side foam adhesive tape 205 may have a first surface in direct contact with the extension component 2042A and an opposing second surface. The first surface of the single-side foam adhesive tape 205 may have adhesiveness, and the second surface of the single-side foam adhesive tape 205 may not have adhesiveness. The single-side foam adhesive tape 205 may prevent dust and moisture from entering the interior of the display device.

In one embodiment, the single-side foam adhesive tape 205 may be black and may be able to prevent light leakage. Thus, extra light-shielding tapes may not be introduced to the display device, which may reduce the fabrication process and fabrication cost of the curved display device. Meanwhile, the product yield may be improved, and the risk of light leakage may be reduced.

It should be noted that, in the disclosed curved display devices, the cover lens and the supporter of the module may be directly fixed/bonded, where "directly fixed/bonded" does not mean that other structures are not provided between the cover lens and the supporter of the module. Even a structure, which is configured to fix/bond the cover lens and the supporter of the module, is provided between the cover lens and the supporter of the module, the cover lens and the supporter may still be "directly fixed/bonded" to each other.

Figure 9:
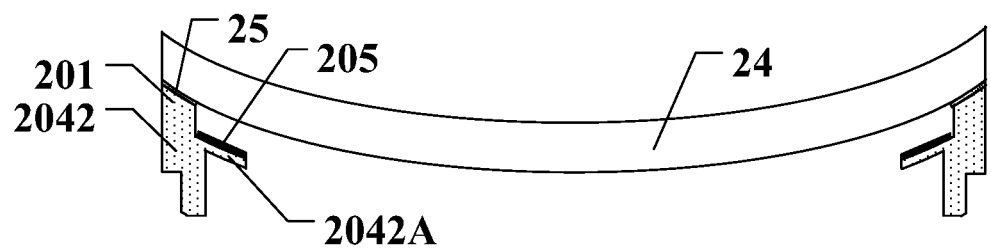
FIG. 9 illustrates a schematic diagram of another exemplary relative position of a cover lens and an plastic frame in another exemplary AA' sectional view in FIG. 6 consistent with disclosed embodiments.

In one embodiment, the cover lens and the supporter may be directly fixed/bonded by a double-side foam adhesive tape, and a corresponding structure is shown in FIG. 9.

FIG. 9 illustrates a schematic diagram of another exemplary relative position of a cover lens and an plastic frame in another exemplary AA' sectional view in FIG. 6 consistent with disclosed embodiments. As shown in FIG. 9, the supporter 201 and the cover lens 24 may be bonded by a double-side foam adhesive tape 25. Theoretically speaking, a bonding between the supporter 201 to the cover lens 24 can be realized by merely using a double-side adhesive tape without foam. However, in the disclosed embodiments, through bonding the supporter 201 and the cover lens 24 by the double-side foam adhesive tape 25, a buffer space may be formed between the supporter 201 and the cover lens 24 during the assembly process, which may reduce the wear of the components due to the assembly pressure during the assembly process.

In one embodiment, the cover lens may have a first side facing the display panel and an opposing second side, and a plurality of touch electrodes may be disposed on the first side of the cover lens. A corresponding structure is shown in FIGS. 10-11.

Figure 10:
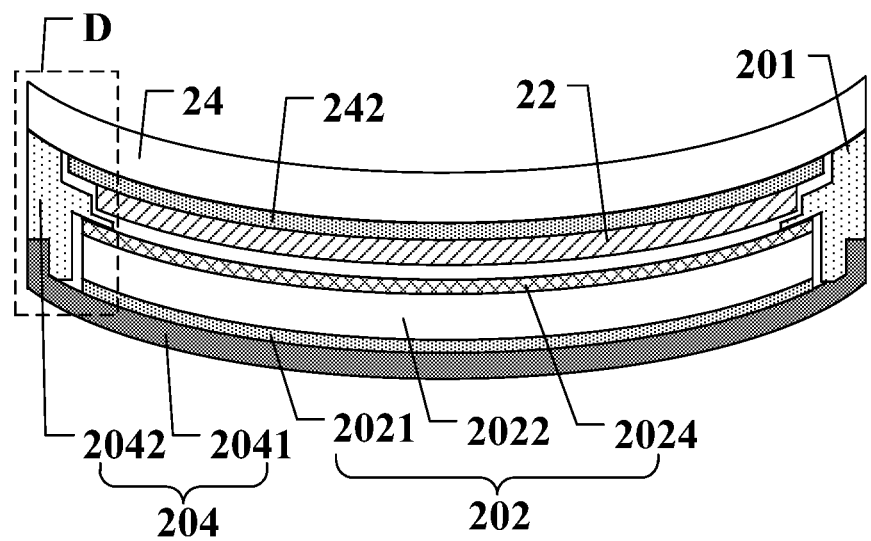
FIG. 10 illustrates another exemplary AA' sectional view of an exemplary curved display device in FIG. 2 consistent with disclosed embodiments.
Figure 11:
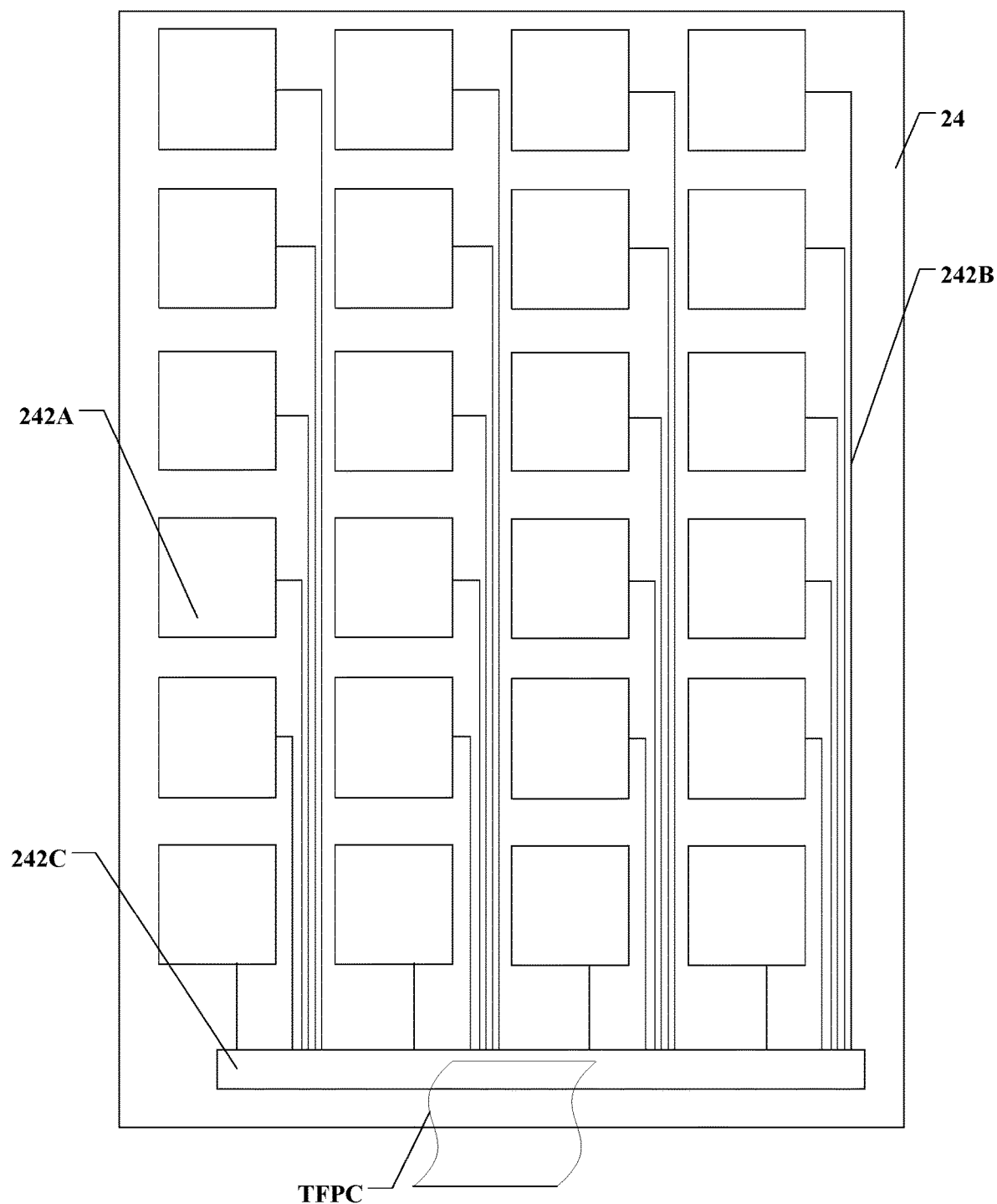
FIG. 11 illustrates a top view of a cover lens in another exemplary AA' sectional view in FIG. 10 consistent with disclosed embodiments.

FIG. 10 illustrates another exemplary AA' sectional view of an exemplary curved display device in FIG. 2 consistent with disclosed embodiments, and FIG. 11 illustrates a top view of a cover lens in another exemplary AA' sectional view in FIG. 10 consistent with disclosed embodiments. As shown in FIGS. 10-11, the cover lens 24 may have a first side facing the display panel 22 and an opposing second side, and a touch control layer 242 may be disposed on the first side of the cover lens 24. The touch control layer 242 may include a plurality of touch control electrodes 242A and a plurality of touch electrode leads 242B. In particular, each touch electrode 242A may be electrically connected with at least one touch electrode lead 242B, and the touch electrode lead 242B may be electrically connected with a touch drive circuit 242C.

It should be noted that, FIG. 11 shows the touch control electrodes 242A are block-shaped, which is for illustrative purposes and is not intended to limit the scope of the present disclosure. In practical applications, the touch control electrodes 242A may have any appropriate shapes, such as a stripe shape, a zig-zag shape.

To realize the touch control of the display panel, in one embodiment, the touch control layer may be disposed on the surface of the cover lens, in another embodiment, the touch control layer may be disposed on the outer surface of the display panel or inside the display panel. For example, the display panel may have a first side facing the cover lens and an opposing second side, and a plurality of touch electrodes may be disposed on the first side of the display panel, and the layout of the touch control electrodes may be the same as FIG. 11 shows.

As shown in FIG. 11, the display device may further include a touch control flexible circuit board TFPC. The touch electrode lead 242B may be electrically connected to the driving circuit 242C, and the driving circuit 242C may be electrically connected to the touch control flexible circuit board TFPC. Thus, a plurality of touch electrode leads 242B may be electrically connected to the touch control flexible circuit board TFPC.

Figure 12:
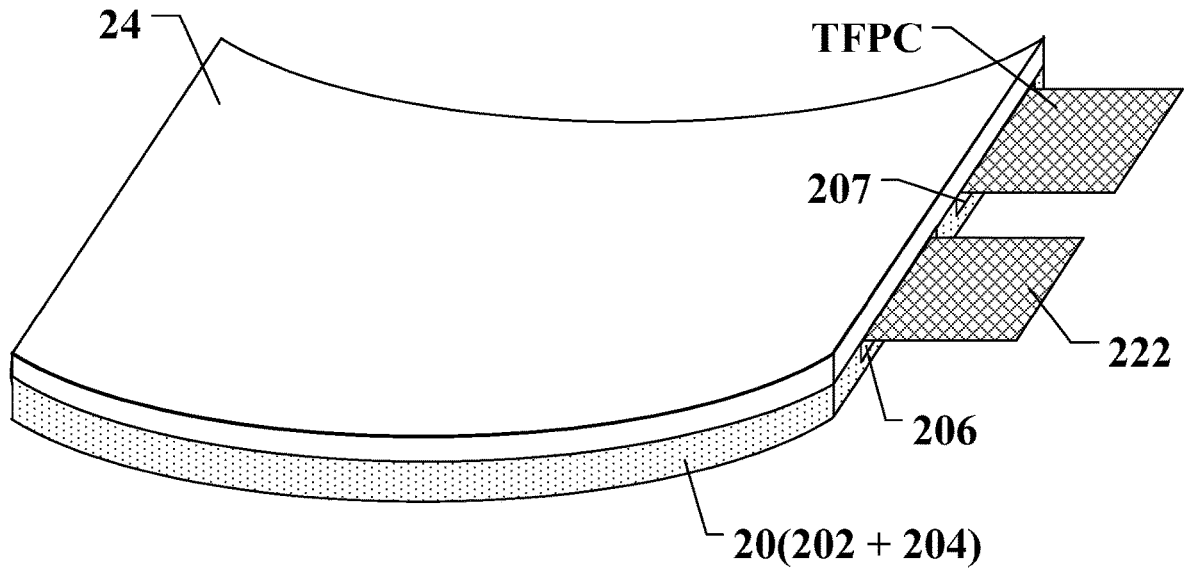
FIG. 12 illustrates a schematic diagram of another exemplary curved display device consistent with disclosed embodiments.

FIG. 12 illustrates a schematic diagram of another exemplary curved display device consistent with disclosed embodiments. As shown in FIG. 10, FIG. 11, and FIG. 12, the module 20 may include an plastic frame 2042, and the plastic frame 2042 may include a supporter 201. The plastic frame 2042 may have a first side close to the touch control flexible circuit board TFPC, and an opposing second side far away from the touch control flexible circuit board TFPC. The plastic frame 2042 may be provided with a second opening 207 at the first side of the plastic frame 2042.

In one embodiment, as shown in FIG. 12, the module 20 may be provided with a first opening 206 and a second opening 207 and, more particular, the first opening 206 and the second opening 207 may be both disposed at the plastic frame 2042. The flexible circuit board 222 which provides signals to the display panel 22 may be go through the first opening 206 to be connected to the external structure, and the touch control flexible circuit board TFPC which provides signals to the touch control electrode layer 242A may go through the second opening 207 to be connected to the external structure.

In one embodiment, the touch control flexible circuit board TFPC for providing signals to the touch electrode layer 242A and the flexible circuit board 222 for providing signals to the display panel 22 may be shared. That is, the entire curved display device may only be provided with one flexible circuit board, and an exemplary structure may be referred to FIG. 2.

In certain embodiments, as shown in FIGS. 6 and 7, the plastic frame 2042 may be provided with the supporter 2042A. For example, the plastic frame 2042 may have a stepped shape, and the extension component of plastic frame 2042 may include a first sub-component and a second sub-component, where the distance between the first sub-component and the cover lens may be smaller than the distance between the second sub-component and the cover lens. A corresponding structure is shown in FIG. 13.

Figure 13:
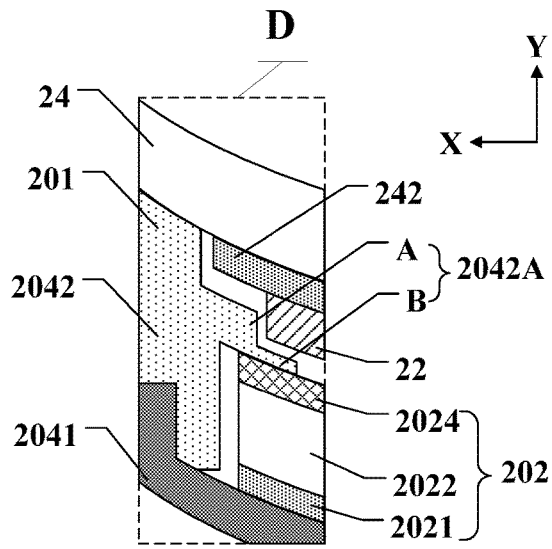
FIG. 13 illustrates an enlarged view of a region D in another exemplary AA' sectional view in FIG. 10 consistent with disclosed embodiments.

FIG. 13 illustrates an enlarged view of a region D in another exemplary AA' sectional view in FIG. 10 consistent with disclosed embodiments. As shown in FIG. 13, the extension component 2042A of the plastic frame 2042 may include a first sub-component A and a second sub-component B. In the horizontal direction X, the first sub-component A may be further away from the optical structure 202 than the second sub-component B. That is, in the horizontal direction X, the distance between the first sub-component A and the optical structure 20 may be longer than the distance between the second sub-component B and the optical structure 20. In the vertical direction Y, the first sub-component A may be closer to the cover lens 24 than the second sub-component B. That is, in the vertical direction Y, the distance between the first sub-component A and the cover lens 24 may be shorter than the distance between the second sub-component B and the cover lens 24. Thus, the entire plastic frame 2042 may exhibit a stepped shape. In the disclosed embodiments, the extension component 2042A may be provided with the first sub-component A and the second sub-component B, which may further fix/bond the optical structure 202 to the module 20.

In particular, as shown in FIG. 13, the edge of the touch control layer 242 disposed on the cover lens 24 may exceed the corresponding edge of the display panel 22. The first sub-component A of the extension component 2042A may correspond to a portion of the touch control layer 242 in which the portion of the touch control layer 242 is arranged beyond the corresponding edge of the display panel 22. The second sub-component B of the extension 2042A may correspond to the corresponding edge of the display panel 22. To prevent the module from causing assembly stress on the display panel 22 and the touch control layer 242 during the assembly process, a first gap may be provided between the first sub-component A of the extension component 2042A and the touch control layer 242, and a second gap may be provided between the second sub-component B of the extension component 2042A and the display panel. Thus, the touch failure, display panel cracks, and/or display failure may be suppressed during the touch control process.

In one embodiment, the second sub-component B of the extension component 2042A may have a first side facing the display panel and an opposing second side, and a single-side foam adhesive tape may be disposed on the first side of the second sub-component B. A corresponding structure is shown in FIG. 14.

Figure 14:
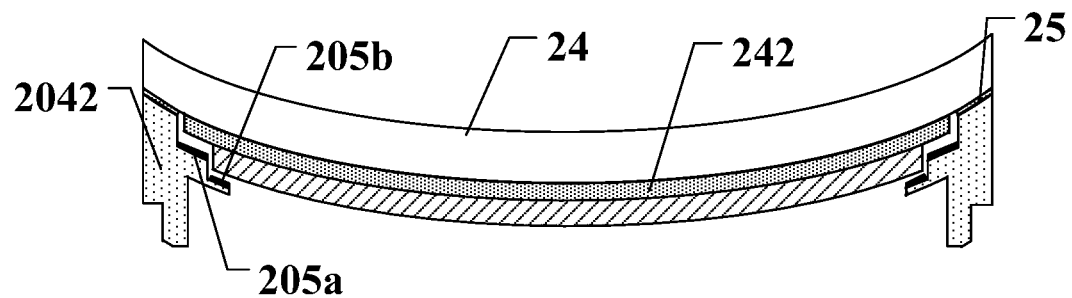
FIG. 14 illustrates a schematic diagram of a relative position of a cover lens, a display panel and an plastic frame in another exemplary AA' sectional view in FIG. 10 consistent with disclosed embodiments.

FIG. 14 illustrates a schematic diagram of a relative position of a cover lens, a display panel and an plastic frame in another exemplary AA' sectional view in FIG. 10 consistent with disclosed embodiments. As shown in FIG. 14, the second sub-component B of the extension component 2042A may have a first side facing the display panel 22 and an opposing second side, and a single-side foam adhesive tape 205b may be disposed on the first side of the second sub-component B. The single-side foam adhesive tape 205b may prevent dust and moisture from entering the interior of the display device.

In one embodiment, the single-side foam adhesive tape 205b may be black tape capable of preventing light leakage. Thus, extra light-shielding tapes may not be introduced to the display device, which may reduce the fabrication process and fabrication cost of the curved display device. Meanwhile, the product yield of the curved display device may be improved, and the risk of light leakage in the curved display device may be reduced.

Further, as shown in FIG. 14, the first sub-component A of the extension component 2042A may have a first side facing the display panel 22 and an opposing second side, and a single-side foam adhesive tape 205a may be disposed on the first side of the first sub-component A. On one hand, in the direction from the optical structure 202 to the cover lens 24, the first sub-component A may be arranged in a region beneath the touch control layer 242, in which the display panel 22 is not disposed in the region beneath the touch control layer 242; on the other hand, first sub-component A may be arranged closer to the touch-control structure 242 than the second sub-component B, such that the single-side foam adhesive tape 205a may be able to reduce the wear under instantaneous large assembly pressure during the assembly process. Meanwhile, the single-side foam adhesive tape 205a may further prevent dust and moisture from entering the display area.

In one embodiment, the single-side foam adhesive tapes 205a may be disposed on the first side of the first sub-component A, or the single-side foam adhesive tapes 205b may be disposed on the first side of the second sub-component B. In another embodiment, as shown in FIG. 14, the single-side foam adhesive tapes 205a may be disposed on the first side of the first sub-component A and, meanwhile, the single-side foam adhesive tapes 205b may be disposed on the first side of the second sub-component B.

The present disclosure also provides a curved surface display device fabrication method.

Figure 15:
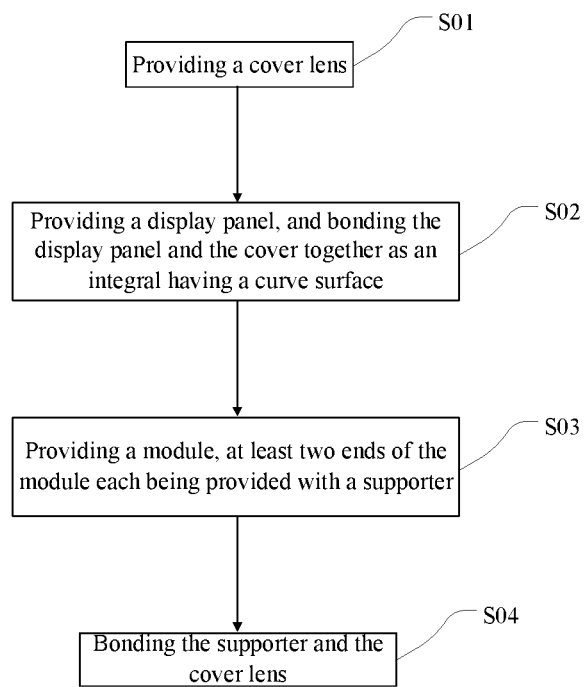
FIG. 15 illustrates a flow chart of an exemplary curved display device fabrication method consistent with disclosed embodiments.
Figure 16:
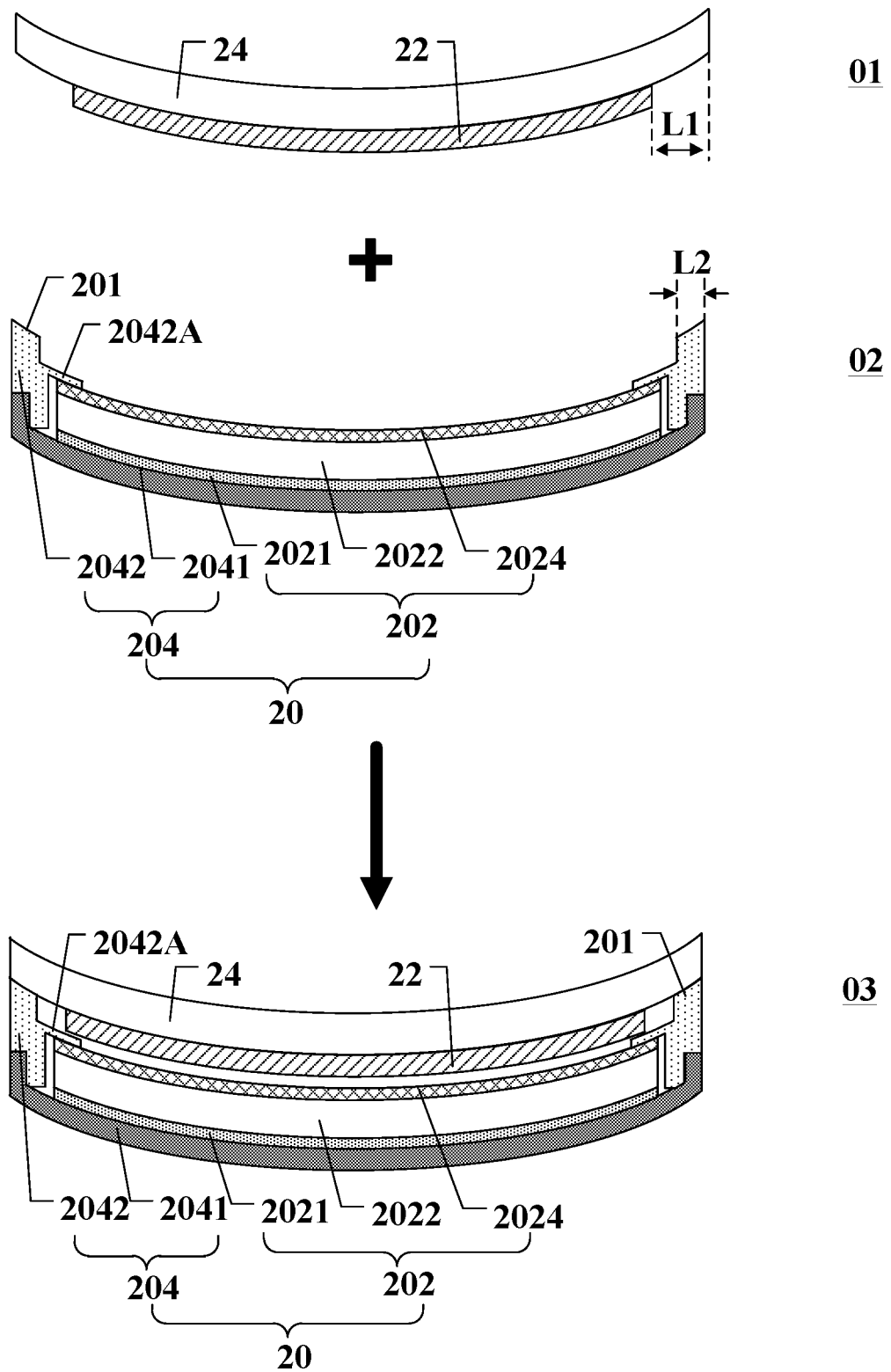
FIG. 16 illustrates cross-sectional views of an exemplary curved display device during certain stages of the fabrication method in FIG. 15 consistent with disclosed embodiments.
Figure 17:
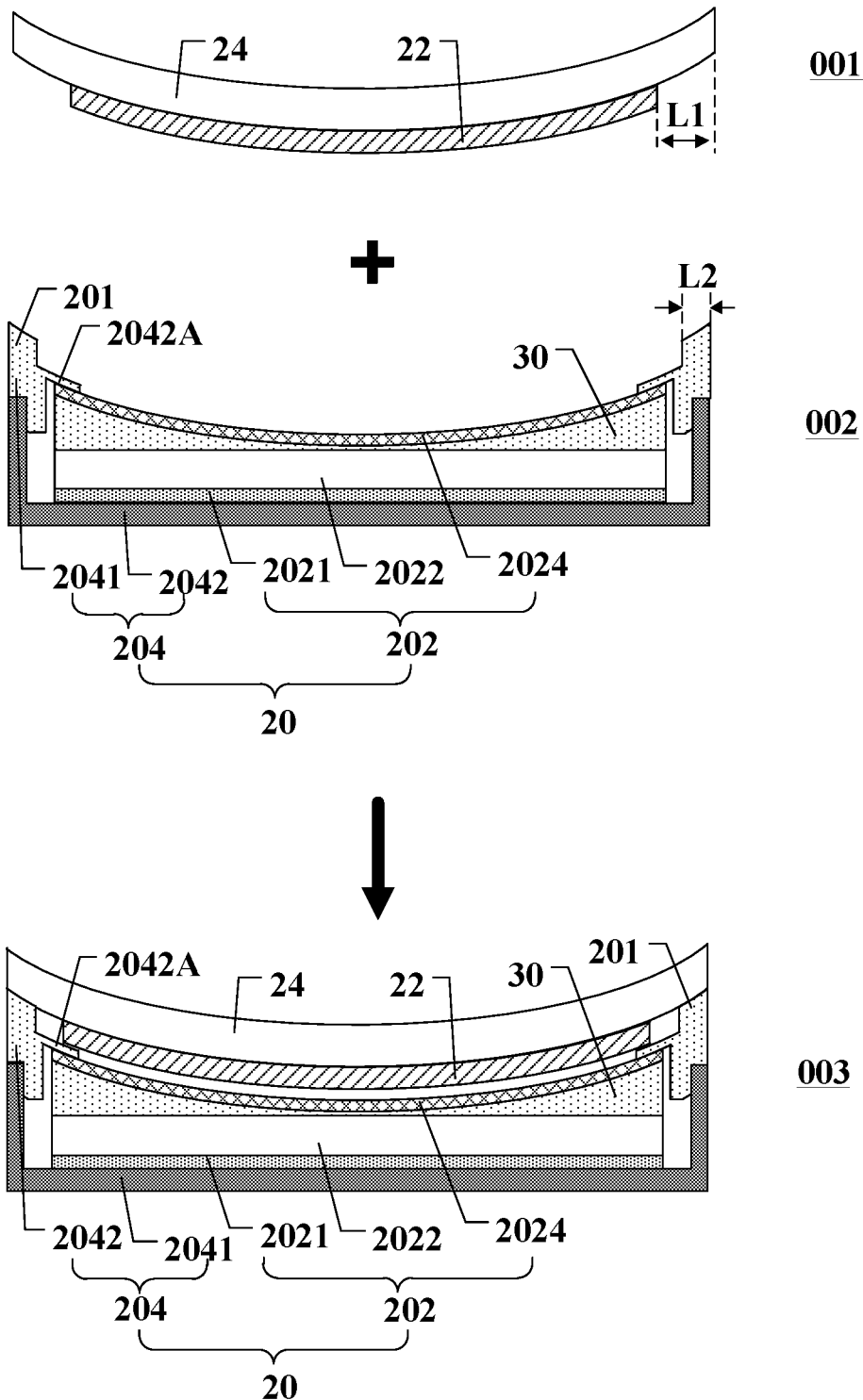
FIG. 17 illustrates cross-sectional views of another exemplary curved display device during certain stages of the fabrication method in FIG. 15 consistent with disclosed embodiments.

FIG. 15 illustrates a flow chart of an exemplary curved display device fabrication method consistent with disclosed embodiments. FIG. 16 illustrates cross-sectional views of an exemplary curved display device during certain stages of the fabrication method in FIG. 15 consistent with disclosed embodiments. FIG. 17 illustrates cross-sectional views of another exemplary curved display device during certain stages of the fabrication method in FIG. 15 consistent with disclosed embodiments.

The curved display device fabrication method may comprise the following steps:

Step S01: providing a cover lens;

Step S02: providing a display panel, and bonding the display panel and the cover together as an integral having a curved surface/shape;

Step S03: providing a module, at least two ends of the module each being provided with a supporter; and Step S04: bonding the supporters and the cover lens.

As shown in FIG. 16, a structure 01 may be obtained after Step S01 and Step S02. In the structure 01, the display panel 22 and the cover lens 24 may be bonded as an integral having a curved shape. Two exemplary methods for bonding the display panel 22 and the cover lens 24 as an integral having a curved shape are explained below.

Method I: a curved cover lens 24 may be provided in the Step S01, a curved display panel 22 may be provided in the Step S02, and the curvature of the curved cover lens 24 may match the curvature of the curved display panel 22. In the Step S02, the curved cover lens 24 and the curved display panel 22 may be boned together by an adhesive, such as optical transparent adhesive, thereby forming a structure 01 in FIG. 16 or a structure 001 in FIG. 17.

Method II: a planar cover lens 24 may be provided in the Step S01, and a planar display panel 22 may be provided in the Step S02. The planar cover lens 24 and the planar display panel 22 may be bonded together by an adhesive, such as optical transparent adhesive. Then through bending the flat cover lens 24 and the flat display panel 22 together to a desired curvature by stamping dies, the structure 01 in FIG. 16 or the structure 001 in FIG. 17 may be obtained.

It should be noted that no matter method I or method II is adopted, all the edges of the cover lens 24 in the final structure 01 in FIG. 16 and the final structure 001 in FIG. 17 may exceed all the edges of the display panel 22.

A structure 02 in FIG. 16 or a structure 002 in FIG. 17 may be obtained in the Step S03. As shown in FIG. 16, the entire module 20 in the structure 02 may have a curved surface. That is, the module 20 may have a first surface facing the display panel 22 and an opposing second surface, both the first surface and the second surface are configured as curved surfaces. However, in practical applications, according to different application scenarios, the first surface of the module 20 may be configured to be a curved surface, while the second surface of the module 20 may be or may not be configured to be a curved surface.

In one embodiment, when the material of the light guide plate 2022 is easily bent and the influence on the optical performance is small after the light guide plate 2022 is bent, the entire module 20 may be configured as a curved structure, and the structure 02 shown in FIG. 16 may be obtained.

Referring to FIG. 17, when the material of the light guide plate is substantially rigid and is not easily bent, the light guide plate 2022 may be configured to have a conventional planar structure. However, a buffer layer 30 may be provided between the light guide plate 2022 and the display panel 22. The buffer layer 30 may have a first surface facing the light guide plate 2022 and an opposing second surface facing the display panel 22. The first surface of the layer 30 (i.e., the side facing the light guide plate 2022) may be configured to be a planar surface, and the second surface of the buffer layer 30 (i.e., the side facing the display panel 22) may be configured to be a curved surface. The buffer layer 30 may be easy to be formed and processed, and the light transmittance of the buffer layer 30 may be substantially high, which is above 90%. Thus, the structure 002 shown in FIG. 17 may be obtained, in which the optical performance of the light guide plate 2022 may not decrease due to the formation of the curved display device.

A structure 03 in FIG. 16 or structure 003 in FIG. 17 may be obtained in Step S04. Through boding the cover lens 24 and the supporter 201 of the module 20, the curved surface display device may be obtained. According to the module selected in the Step S03, the structure 03 in FIG. 16 or structure 003 in FIG. 17 may be obtained In the disclosed embodiments, in the structure 01 in FIG. 16 or the structure 001 in FIG. 17, the distance between the edge of the cover lens 24 and the edge of the display panel 22 may have to be measured before starting the Step S03. For example, before starting the Step S03, the distance between the edge of the cover lens 24 and the edge of the display panel may be measured to be a first width L1. Then in the Step S03, the width of the supporter 201 in the module 20 may be determined as a second width L2, and the second width L2 may be smaller than the first width L1.

In one embodiment, the ratio of the second width L2 to the first width L1 may be configured to be approximately 0.5-0.9. The alignment during the assembly process is realized through aligning the cover lens 24 and the supporter 201, and a certain alignment error may exist during the alignment. To ensure that no additional load is applied to the display panel 22 during the assembly process, the ratio of the second width L2 to the first width L1 may be configured to be less than approximately 0.9. In certain embodiments, the touch control electrodes may be disposed on the first side of the cover lens 24 (i.e., the side facing the display panel 22). To ensure the stability of the touch control structure, the edge of the touch structure may have to be considered when determining the second width L2. However, the difference between the second width L2 and the first width L1 may not be desired to be substantially large, and the second width L2 may be desired to be at least greater than half of the first width L1, so as to ensure that the border of the finally formed curved display device is not substantially large due to the assembly process.

In addition, the first width L1 may be often fixed, and when the second width L2 is reduced, the support effect may be degraded accordingly. Thus, through configuring the ratio of the second width L2 to the first width L1 to be approximately 0.5 to 0.9, the overall performance of the fabricated curved display device may be ensured.

In particular, during the practical assembly process, the first width L1 may be measured first, and then an appropriate module 20 may be selected. Provided that in the assembly process, the edge of the cover lens 24 and the edge of the supporter 201 are aligned, then the width of the supporter 201 may be determined. That is, the width of the second width L2 may be selected to be smaller than the first width L1 by approximately 0.2 mm to 2 mm.

Further, the module 20 may include an plastic frame 2042, and the plastic frame 2042 may include the supporter 201. The supporter 201 may have a first surface facing the display panel 22 and an opposing second surface, and before the module 20 is bonded with the cover lens 24, the first side of the supporter 201 may be attached with a double-side foam adhesive tape. The structure of the supporter 201 after being attached with the double-side foam adhesive tape on the first surface of the supporter 201 may be referred to FIGS. 9 and 11.

The double-side foam adhesive tape may not only bond the cover lens 24 and the module 20, but also function as a buffer. In particular, an external force may be inevitably applied to bond the cover lens 24 and the module 20 during the assembly process. As a result, momentary large assembly stresses may be likely to occur during the assembly process. The double-side foam adhesive tape may have a certain buffering effect, which may reduce the wear between the cover lens 24 and the module 20.

It should be noted that, the use of double-side foam adhesive tape is only a bonding method to bond the cover lens 24 and the module 20 during the assembly process. In another embodiment, a double-side adhesive tape without foam may be used directly. In another embodiment, between the supporter 201 of the module 20 and the cover lens 24, a structure capable of being fitted/engaged into each other may be provided, and the supporter 201 of the module 20 and the cover lens 24 may be bonded through an engaging manner.

In one embodiment, the plastic frame 2042 may include an extension component 2042A, and the extension component 2042A may have a first surface facing the display panel 22 and an opposing second surface. Before the module 20 is bonded with the cover lens 24, a single-side foam adhesive tape may be attached to the first surface of the extension component 2042A. The structure of the extension component 2042A after being attached with the single-side foam adhesive tape may refer to FIG. 9 and FIG. 14. In one embodiment, the single-side foam adhesive tape may be black, which may be able to prevent light leakage, and prevent dust and moisture from entering the interior of the display device.

Compared with the existing curved display panel and fabrication method thereof, in the disclosed curved surface display device and the fabrication method thereof, the cover lens and the module may be directly fixed/bonded, and the display panel may be not in direct contact with the module. Thus, the module may be prevented from generating an additional load on the display panel during the assembly process, and the overall optical performance of the display panel may be enhanced.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A curved display device, comprising:
   a cover lens;
   a display panel, wherein the display panel and the cover lens are bonded together as an integral structure having a curved surface; and
   a module, including a plastic frame, wherein the plastic frame includes:
     a supporter, provided at each of at least two ends of the module, and
     an extension component, in a direct contact with an optical structure of the module, wherein the supporter provided at the each of at least two ends of the module is directly bonded to the cover lens.

2. The curved display device according to claim 1, wherein:
   the module comprises an optical structure including a light guide plate and a prism sheet; and
   a gap is provided between the display panel and the optical structure.

3. The curved display device according to claim 1, wherein:
   the display panel comprises a flexible circuit board;
   the module has a first side close to the flexible circuit board and an opposing second side far away from the flexible circuit board; and
   a first opening is provided at the first side of the module.

4. The curved display device according to claim 1, wherein:
   the extension component and the display panel have an overlapped region;
   a first gap is provided between the display panel and the extension component at the overlapped region; and
   the first gap is approximately greater than or equal to 0.2 mm and less than or equal to 0.4 mm.

5. The curved display device according to claim 1, wherein:
   the cover lens and the supporter are bonded by a double-side foam adhesive tape.

6. The curved display device according to claim 1, wherein:
   the extension component has a first side facing the display panel and an opposing second side; and
   a single-side foam adhesive tape is provided on the first side of the extension component.

7. The curved display device according to claim 1, wherein:
   the module comprises a back plate; and
   the supporter provided at the each of at least two ends of the module is engaged into the back plate.

8. The curved display device according to claim 1, wherein:
   the display panel has a first side facing the cover lens and an opposing second side; and
   a plurality of touch control electrodes are disposed on the first side of the display panel.

9. The curved display device according to claim 1, wherein:
   a gap is provided between the display panel and the supporter.

10. The curved display device according to claim 1, wherein:
    the plastic frame has a stepped shape; and
    the extension component includes a first sub-component and a second sub-component, wherein a distance between the first sub-component and the cover lens is smaller than a distance between the second sub-component and the cover lens.

11. The curved display device according to claim 10, wherein:
    the second sub-component of the extension component has a first side facing the display panel and an opposing second side; and
    a single-side foam adhesive tape is disposed on the first side of the second sub-component of the extension component.

12. The curved display device according to claim 11, wherein:
    the first sub-component of the extension component has a first side facing the display panel and an opposing second side; and
    the single-side foam adhesive tape is also disposed on the first side of the first sub-component of the extension component.

13. The curved display device according to claim 1, wherein:
    the cover lens has a first side facing the display panel and an opposing second side; and
    a plurality of touch control electrodes are disposed on the first side of the cover lens.

14. The curved display device according to claim 13, further comprising:
    a plurality of touch electrode leads and a touch control flexible circuit board, wherein a touch control electrode of the plurality of touch control electrodes is electrically connected to at least one touch electrode lead of the plurality of touch electrode leads, and the plurality of touch electrode leads are electrically connected to the touch control flexible circuit board.

15. The curved display device according to claim 14, wherein:

the module comprises a plastic frame;

the plastic frame comprises the supporter provided at the each of at least two ends of the module; and the plastic frame has a first side close to the touch control flexible circuit board and an opposing second side far away from the touch control flexible circuit board, and a second opening is provided at the first side of the plastic frame.

16. A fabrication method for a curved display device, comprising:

providing a cover lens;

providing a display panel, and bonding the display panel and the cover together as an integral structure having a curved surface;

providing a module, including a plastic frame, wherein the plastic frame includes:

a supporter provided at each of at least two ends of the module, and an extension component, in a direct contact with an optical structure of the module; and bonding the supporter of the plastic frame provided at the each of at least two ends of the module directly to the cover lens.

17. The fabrication method according to claim 16, wherein:

a gap is provided between the display panel and the supporter.

18. The fabrication method according to claim 16, wherein the module includes a plastic frame, the plastic frame includes the supporter provided at the each of at least two ends of the module, and the supporter has a first surface facing the display panel and an opposing second surface, the fabrication method further comprises:

before bonding the supporter provided at the each of at least two ends of the module to the cover lens, attaching a double-side foam adhesive tape to the first side of the supporter.

19. The fabrication method according to claim 18, wherein the plastic frame includes an extension component, and the extension component has a first surface facing the display panel and an opposing second surface, the fabrication method further comprises:

before bonding the supporter provided at the each of at least two ends of the module to the cover lens, attaching a single-side foam adhesive tape to the first side of the extension component.

* * * * *